(12) United States Patent
Czubarow et al.

(10) Patent No.: US 8,470,936 B2
(45) Date of Patent: Jun. 25, 2013

(54) LIQUID EPOXY RESIN COMPOSITION FOR SEMICONDUCTOR ENCAPSULATION

(75) Inventors: Pawel Czubarow, Wellesley, MA (US); Osamu Suzuki, Niigata (JP); Toshiyuki Sato, Niigata (JP); Kazuyoshi Yamada, Niigata (JP); Kaori Matsumura, Niigata (JP)

(73) Assignee: Namics Corporation, Niigata-shi (JP)

( * ) Notice: Subject to any disclaimer, the term of this patent is extended or adjusted under 35 U.S.C. 154(b) by 0 days.

(21) Appl. No.: 13/193,848

(22) Filed: Jul. 29, 2011

(65) Prior Publication Data

US 2013/0026661 A1 Jan. 31, 2013

(51) Int. Cl.
| | |
|---|---|
| C08K 7/18 | (2006.01) |
| C08K 3/36 | (2006.01) |
| C08K 9/10 | (2006.01) |
| C08L 63/00 | (2006.01) |
| C08L 63/02 | (2006.01) |
| C08L 63/04 | (2006.01) |
| H01L 23/29 | (2006.01) |
| H05K 1/03 | (2006.01) |

(52) U.S. Cl.
USPC ........... 525/423; 250/259; 257/793; 523/211; 523/466; 525/109; 525/114; 525/120; 525/121; 525/122

(58) Field of Classification Search
None
See application file for complete search history.

(56) References Cited

U.S. PATENT DOCUMENTS

| | | | |
|---|---|---|---|
| 5,189,082 A | 2/1993 | Kim et al. | |
| 5,252,700 A * | 10/1993 | Okikawa et al. | 528/353 |
| 5,349,029 A | 9/1994 | Nam | |
| 6,492,438 B1 * | 12/2002 | Nomura | 523/466 |
| 6,916,538 B2 | 7/2005 | Noro et al. | |
| 2010/0308477 A1 | 12/2010 | Akizuki et al. | |
| 2013/0026660 A1 * | 1/2013 | Czubarow et al. | 257/788 |

FOREIGN PATENT DOCUMENTS

| | | |
|---|---|---|
| JP | 1-188518 A | 7/1989 |
| JP | 3-197527 A | 8/1991 |
| JP | 3-223324 A | 10/1991 |
| JP | 6-151652 A | 5/1994 |
| JP | 2010-077234 A | 4/2010 |
| JP | 2010-280804 A | 12/2010 |

OTHER PUBLICATIONS

U.S. Appl. No. 13/193,822, Czubarow et al., Jul. 29, 2011.*

* cited by examiner

*Primary Examiner* — Robert Sellers
(74) *Attorney, Agent, or Firm* — Holtz Holtz Goodman & Chick PC

(57) ABSTRACT

A liquid epoxy resin composition for semiconductor encapsulation comprising: (A) at least one epoxy resin, (B) at least one curing accelerator and (C) at least one acid anhydride terminated polyamic acid. The liquid epoxy resin composition provides a cured material that has an excellent adhesiveness to a semiconductor chip surface and has an excellent moisture resistance.

10 Claims, 3 Drawing Sheets

400 a : 1848cm$^{-1}$    carboxylic acid anhydride·saturated 5-membered ring C=O b : 1760cm$^{-1}$    carboxylic acid anhydride·saturated 5-membered ring C=O 1 : 1772cm$^{-1}$    carboxylic acid anhydride C=O
2 : 1707cm$^{-1}$    saturated carboxylic acid anhydride C=O
3 : 1660cm$^{-1}$    amide I absorption
4 : 1540cm$^{-1}$    amide II absorption 4:1540cm⁻¹ amide II absorption

LIQUID EPOXY RESIN COMPOSITION FOR SEMICONDUCTOR ENCAPSULATION

TECHNICAL FIELD

The present invention relates to a liquid epoxy resin composition for semiconductor encapsulation and semiconductor device using the same.

BACKGROUND ART

The electronic industry has sustained decades of continual reduction of the dimensional scale of integrated circuit features. At the same time, the dimensional scales of both the transistors in the integrated circuits and the electrical connections to the semiconductor chip have also been reduced. The reduction of the scale of transistors allowed more functionality to be integrated into a single chip. More chip functionality provides for the plethora of functionality found in modern electronic devices such as smartphones that can play music, play videos, capture images and communicate using a variety of wireless protocols.

More functionality also calls for more electrical connections into the semiconductor chip and into a package in which it is contained. A semiconductor is typically provided in a package which is sold to original equipment manufacturer (OEM) customers who mount the package on their printed circuit boards (PCB). Alternatively, semiconductor chips without packages are mounted directly on PCBs. The latter attract attention since it is advantageous in terms of an increase in an electric connection and a decrease in cost.

In order to provide mechanical reinforcement between the semiconductor chip and the substrate on which the chip is placed, an underfill material is usually placed. A liquid epoxy resin composition used for existing underfill comprises an epoxy resin and may include other ingredients such as a silica filler, a silane coupling agent and a fluorinated or silicone defoamer. The liquid epoxy resin composition is cured after the space between the semiconductor chip and the substrate on which the chip is placed is filled with it.

As stated above, semiconductor chips are used in portable electronic gadgets such as smartphones. Such portable electronic gadgets, however, are not always treated as sensitive electronic devices, and it is to be expected that they may be dropped, abused or subjected to mechanical shocks. In addition, they might be used in very bad environmental conditions, such as under hot and humid conditions. Against these backgrounds, as for the liquid epoxy resin composition used for underfill, it is demanded that the cured material thereof has an excellent adhesiveness to the semiconductor chip surface and has an excellent moisture resistance.

In recent years, liquid epoxy resin compositions that have an excellent adhesiveness to semiconductor chip surfaces have been proposed (for instance, see patent documents 1 and 2).

PRIOR ART DOCUMENTS

Patent Documents

[Patent Document 1] US2010/0308477A1 (non-examined patent publication)
[Patent Document 2] JP-A-2010-77234 (non-examined patent publication)

SUMMARY OF THE INVENTION

Problems to be Solved by the Invention

Against a background of the improvement of electronic device functionality as discussed hereinabove, the demand level for a liquid epoxy resin composition for semiconductor encapsulation has increased. An object of the present invention is to provide a liquid epoxy resin composition for semiconductor encapsulation that has good curability and fluidity and can provide a cured material having excellent adhesiveness to a semiconductor chip surface and having an excellent moisture resistance, and a semiconductor device encapsulated by the liquid epoxy resin.

Means for Solving Problems

As a result of wholeheartedly experimentations, the present inventors discovered that the above object can be accomplished by a liquid epoxy resin composition for semiconductor encapsulation made by blending a curing accelerator and an acid anhydride terminated polyamic acid with an epoxy resin.

The present inventors found that the liquid epoxy resin composition for semiconductor encapsulation made by blending by blending a curing accelerator(s) and an acid anhydride terminated polyamic acid(s) with an epoxy resin(s) has good curability and fluidity, can improve the adhesiveness between the semiconductor chip surface and the cured material of this liquid epoxy resin composition and additionally can reduce the degradation of adhesiveness, even in the presence of moisture. The following are considered as the mechanisms, although the mechanisms are not necessarily certain.

In the curing process of the composition, an acid anhydride terminal is hydrolyzed in the presence of moisture and the terminal end is transformed into a highly-polar dicarboxylic acid.

An imide bond is formed by reacting this dicarboxylic acid moiety with an amide bond formed in surface polyimide passivation coating.

It is considered that the degradation of adhesiveness may be reduced in this way.

The present invention 1 relates to a liquid epoxy resin composition for semiconductor encapsulation comprising: (A) at least one epoxy resin, (B) at least one curing accelerator and (C) at least one acid anhydride terminated polyamic acid.

The present invention 2 relates to the liquid epoxy resin composition for semiconductor encapsulation of the present invention 1, wherein 0.05 to 20 parts by weight of the acid anhydride terminated polyamic acid are present based on 100 parts by weight of the epoxy resin.

The present invention 3 relates to the liquid epoxy resin composition for semiconductor encapsulation of the present invention 1, wherein the acid anhydride terminated polyamic acid is a compound obtainable by reacting a tetracarboxylic dianhydride in a proportion of more than 1 mol with a diamine compound of 1 mol.

The present invention 4 relates to the liquid epoxy resin composition for semiconductor encapsulation of the present invention 1, wherein the curing accelerator is at least one compound selected from an imidazole compound and a tertiary amine compound other than an imidazole compound.

The present invention 5 relates to the liquid epoxy resin composition for semiconductor encapsulation of the present invention 4, wherein the curing accelerator comprises the imidazole compound.

The present invention 6 relates to the liquid epoxy resin composition for semiconductor encapsulation of the present invention 5, wherein the curing accelerator(s) further comprises the tertiary amine compound other than an imidazole compound.

The present invention 2 relates to the liquid epoxy resin composition for semiconductor encapsulation of the present invention 4, wherein 0.01 to 10 parts by weight of the imidazole compound is present based on 100 parts by weight of the epoxy resin.

The present invention 8 relates to the liquid epoxy resin composition for semiconductor encapsulation of the present invention 4, wherein 0.002 to 10 parts by weight of the tertiary amine compound other than an imidazole compound is present based on 100 parts by weight of the epoxy resin.

The present invention 9 relates to the liquid epoxy resin composition for semiconductor encapsulation of the present invention 4, wherein the tertiary amine compound other than an imidazole compound is selected from the group consisting of 1,8-diazabicyclo[5.4.0]undec-7-ene (DBU) and 1,5-diazabicyclo[4.3.0]-5-nonene (DBN).

The present invention 10 relates to the liquid epoxy resin composition for semiconductor encapsulation of the present invention 4, wherein the weight ratio of the tertiary amine compound other than an imidazole compound to the acid anhydride terminated polyamic acid is 0.001 to 6.

The present invention 1 relates to the liquid epoxy resin composition for semiconductor encapsulation according any one of claim 1, further comprising at least one curing agent (E) selected from the group consisting of phenol resins and acid anhydrides.

The present invention 12 relates to the liquid epoxy resin composition for semiconductor encapsulation of the present invention 1, further comprising at least one inorganic filler.

The present invention 13 relates to a flip chip semiconductor device comprising a substrate and a semiconductor, wherein the semiconductor is secured to the substrate by a liquid epoxy resin composition of the present invention 1.

The present invention 14 relates to the flip chip semiconductor device of the present invention 13, wherein the curing accelerator is at least one compound selected from an imidazole compound and a tertiary amine compound other than an imidazole compound.

The present invention 15 relates to the flip chip semiconductor device of the present invention 14, wherein the curing accelerator comprises the imidazole compound.

The present invention 162 relates to the flip chip semiconductor device of the present invention 14, wherein the curing accelerator(s) further comprises the tertiary amine compound other than an imidazole compound.

The present invention 17 relates to the flip chip semiconductor device of the present invention 14, wherein the tertiary amine compound other than an imidazole compound is selected from the group consisting of 1,8-diazabicyclo[5.4.0]undec-7-ene (DBU) and 1,5-diazabicyclo[4.3.0]-5-nonene (DBN).

The present invention 18 relates to an assembly comprising: a printed circuit substrate; a semiconductor die; and a cured material of a liquid epoxy resin composition of the present invention 1, the cured material is positioned between the printed circuit substrate and the semiconductor die, so that the semiconductor die is secured to the printed circuit substrate.

The present invention 19 an assembly of the present invention 18, the curing accelerator is at least one compound selected from an imidazole compound and a tertiary amine compound other than an imidazole compound.

The present invention 20 relates to the assembly of the present invention 19, wherein the curing accelerator comprises the imidazole compound.

The present invention 21 relates to the assembly of the present invention 19, wherein the curing accelerator(s) further comprises the tertiary amine compound other than an imidazole compound.

The present invention 22 relates to the assembly of the present invention 19, wherein the tertiary amine compound other than an imidazole compound is selected from the group consisting of 1,8-diazabicyclo[5.4.0]undec-7-ene (DBU) and 1,5-diazabicyclo[4.3.0]-5-nonene (DBN).

Effects of the Invention

The liquid epoxy resin composition for semiconductor encapsulation of the present invention has good curability and fluidity and is excellent in adhesiveness to the semiconductor chip surface and can provide the cured material that is excellent in moisture resistance. The problem that the delamination occurs between an underfill and a semiconductor chip under the physical impact and the high temperature humidity can be resolved by using the liquid epoxy resin composition for semiconductor encapsulation of the present invention as an underfill.

BEST MODE TO CARRY OUT THE INVENTION

Figure 1:
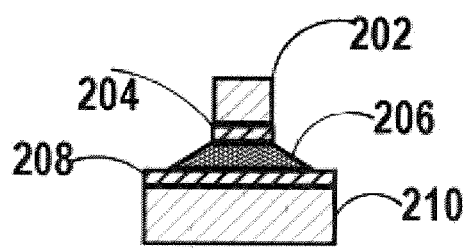
FIG. 1 is a schematic drawing of the sample used in the bonding strength test of the Examples.

The present invention relates to a liquid epoxy resin composition for semiconductor encapsulation comprising:
(A) at least one epoxy resin,
(B) at least one curing accelerator and
(C) at least one acid anhydride terminated polyamic acid.

As used herein, "liquid state at normal temperature" means having fluidity at 10 to 35 degrees C.

(A) Epoxy Resin

The epoxy resin (A) in the present invention is not specifically limited so long as it is an epoxy compound that has two or more epoxy groups in one molecule. The epoxy resin is preferably a liquid state at a normal temperature, however, even if it is a solid state at a normal temperature, it can be used in a liquid state by dissolving it in other liquid epoxy resins or a diluent.

As the epoxy resin (A), a bisphenol A type epoxy resin, a brominated bisphenol A type epoxy resin, a bisphenol F type epoxy resin, a biphenyl type epoxy resin, a novolac type epoxy resin, an alicyclic epoxy resin, a naphthalene type epoxy resin, an ether series or polyether series epoxy resin, an oxirane ring-containing polybutadiene, a silicone epoxy copolymer resin and the like may be mentioned.

As an epoxy resin in a liquid state, a bisphenol A type epoxy resin having an average molecular weight of about 400 or less; a branched polyfunctional bisphenol A type epoxy resin such as p-glycidyloxyphenyl dimethyltolylbisphenol A diglycidyl ether; a bisphenol F type epoxy resin; a phenol novolac type epoxy resin having an average molecular weight of about 570 or less; an alicyclic epoxy resin such as vinyl(3, 4-cyclohexene)dioxide, methyl 3,4-epoxycyclohexylcarboxylate (3,4-epoxycyclohexyl), bis(3,4-epoxy-6-methylcyclohexylmethyl)adipate and 2-(3,4-epoxycyclohexyl)-5,1-spiro(3,4-epoxycyclohexyl)-m-dioxane; a biphenyl type epoxy resin such as 3,3',5,5'-tetramethyl-4,4'-diglycidyloxy-biphenyl; a glycidyl ester type epoxy resin such as diglycidyl hexahydrophthalate, diglycidyl 3-methylhexahydro phthalate and diglycidyl hexahydroterephthalate; a glycidylamine type epoxy resin such as diglycidylaniline, diglycidyl-toluidine, triglycidyl-p-aminophenol, tetraglycidyl-m-xylylene diamine, tetraglycidylbis(aminomethyl)cyclohexane; a hidantoin type epoxy resin such as 1,3-diglycidyl-5-methyl-5-ethylhidantoin; and a naphthalene ring-containing epoxy resin may be mentioned. Also, an epoxy resin having silicone skeletone such as 1,3-bis(3-glycidoxy-propyl)-1,1,3,3-tetramethyldisiloxane may be used. Moreover, a diepoxide compound such as (poly)ethylene glycol diglycidyl ether, (poly)propylene glycol diglycidyl ether, butanediol diglycidyl ether and neopentyl glycol diglycidyl ether; and a triepoxide compound such as trimethylolpropane triglycidyl ether and glycerin triglycidyl ether may be mentioned.

It is also possible to use a solid state or ultra-high viscosity epoxy resin at a normal temperature together. As such an epoxy resin, a bisphenol A type epoxy resin, novolac epoxy resin and tetrabromobisphenol A type epoxy resin, each of which has a higher molecular weight, may be mentioned. These epoxy resins may be used in combination with the epoxy resin which is in a liquid state at a normal temperature and/or a diluent to control the viscosity.

As an epoxy resin having a low viscosity at a normal temperature, a diepoxide compound such as (poly)ethyleneglycol diglycidyl ether, (poly)propyleneglycol diglycidyl ether, butanediol glycidyl ether and neopentylglycol diglycidyl ether; and a triepoxide compound such as trimethylolpropane triglycidyl ether and glycerin triglycidyl ether may be mentioned.

A diluent may be a non-reactive diluent or a reactive diluent, however, a reactive diluent is preferable. As used herein, a reactive diluent means a compound having an epoxy group and having a low viscosity at a normal temperature, depending on the purposes, which may further have a polymerizable functional group other than the epoxy group, for example, an alkenyl group such as vinyl and allyl; an unsaturated carboxylic acid residue such as acryloyl and methacryloyl. As such a reactive diluent, a monoepoxide compound such as n-butylglycidyl ether, 2-ethylhexyl glycidyl ether, phenyl gylcidyl ether, cresyl glycidyl ether, p-s-butylphenyl glycidyl ether, styrene oxide and a-pinene oxide; a monoepoxide compound having other functional group such as allyl glycidyl ether, glycidyl methacrylate, and 1-vinyl-3,4-epoxycyclohexane may be mentioned.

The epoxy resin may be used alone or in combination of two or more kinds. It is preferred that the epoxy resin itself is a in liquid state at a normal temperature, and above all, preferred are a liquid state bisphenol type epoxy resin, a liquid state aminophenol type epoxy resin, a silicone-modified epoxy resin and naphthalene type epoxy resin. More preferably mentioned are a liquid state bisphenol A type epoxy resin, a liquid state bisphenol F type epoxy resin, a p-aminophenol type liquid state epoxy resin and 1,3-bis(3-glycidoxypropyl)tetramethyl disiloxane.

(B) Curing Accelerator

As the curing accelerator (B) in the present invention, it is not specifically limited so long as it accelerates curing of epoxy resins, an imidazole compound; a tertiary amine compound other than an imidazole compound; a triazine compound, dicyandiamide; organic acid hydrazide; and a phosphorous curing accelerator may be mentioned. As the phosphorous curing accelerator, a tertiary phosphine such as triphenyl phosphine, phosphonium salt such as tetraphenyl phosphonium tetraphenyl borate may be mentioned.

As the curing accelerator (B), the imidazole compound and the tertiary amine compound other than an imidazole compound are preferred in terms of obtaining good adhesiveness, moisture resistance and curability. The imidazole compound and the tertiary amine compound may be used alone or in combination.

As the imidazole compound, imidazole, 2-methylimidazole, 2-ethylimidazole, 2-isopropylimidazole, 2-undecylimidazole, 2-dodecylimidazole, 2-phenylimidazole, 2-ethyl-4-methyl-imidazole, 2-benzylimidazole, 2,4,5-trimethylimidazole and the like may be mentioned.

As the imidazole compound, an epoxy adduct with an imidazole compound, a urea adduct with an imidazole compound and a compound in which an isocyanate compound is added to a hydroxyl group of an epoxy adduct with an imidazole compound may also be used.

The epoxy adduct can be obtained by reacting an imidazole compound with an epoxy compound. After that, an isocyanate compound may also be subjected to addition reaction to the hydroxyl group of the epoxy adduct.

As the epoxy compound, there may be mentioned 1,2-epoxybutane, 1,2-epoxyhexane, 1,2-epoxyoctane, styreneoxide, n-butyl glycidyl ether, hexyl glycidyl ether, phenyl glycidyl ether, glycidyl acetate, glycidyl butyrate, glycidyl hexoate, glycidyl benzoate and the like.

As the isocyanate compound, there may be mentioned phenyl isocyanate, p-methyl phenyl isocyanate, o-methyl phenyl isocyanate, p-methoxyphenyl isocyanate, 2,4-dimethylphenyl isocyanate, o-chlorophenyl isocyanate, p-chlorophenyl isocyanate, methyl isocyanate, ethyl isocyanate, propyl isocyanate, butyl isocyanate, hexyl isocyanate and the like.

The urea adduct can be obtained by reacting an imidazole compound, a urea compound, and optionally an isocyanate compound. The imidazole compound and the isocyanate compound include those as exemplified above. As the urea compound, there may be mentioned urea, thiourea and the like.

The material in which isocyanate compound is subjected to addition reaction with a hydroxyl group of an epoxy adduct also contains a so-called microcapsulated imidazole and, for example, is available as NOVACURE HX-3088 and NOVACURE HX-3722 (each available from Asahi Kasei Chemicals Corp., trade name), and the like.

In addition, the imidazole compound may be used in the form of an inclusion compound that contains an imidazole compound and an acid. As the acid, isophthalic acid or derivatives thereof (an isophthalic acid having substituent groups such as alkyl group, aryl group and the like) may be mentioned. The inclusion compound can be obtained by dissolving or suspending the above-mentioned imidazole compound and acid in a solvent, and heating the resultant. As such an inclusion compound, the one described in JP-A-2007-39449 may be used.

Moreover, the imidazole compound may be used in the form of an inclusion compound in which an imidazole compound is a guest and a carboxylic acid derivative is a host. As the carboxylic acid derivatives, tetrakisphenyl compounds such as tetrakis(4-hydroxyphenyl)ethane and tetrakis(4-hydroxyphenyl)ethane tetramethyl ester may be mentioned. As such an inclusion compound, the one described in JP-A-Hei05-201902 may be used.

The imidazole compound may be used alone or in combination of two or more kinds.

The imidazole compound may be used in an amount of 0.01 to 10 parts by weight, preferably 0.03 to 9 parts by weight, based on 100 parts by weight of the epoxy resin (A), in terms of obtaining good adhesiveness, moisture resistance and curability.

The tertiary amine compound other than an imidazole compound is a compound having one or more tertiary amino group. As for the tertiary amine compound, there may be mentioned aliphatic tertiary amine compounds such as methyldiethylamine, dimethylethylamine, triethylamine, tripropylamine, tributylamine, trihexylamine, triethylenediamine (1,4-diazabicyclo[2.2.2]octane (DABCO)), hexamethylenetetramine, N,N,N',N'-tetramethylethylenediamine, N-methylpyrrolidine, N-methylpiperidine, N,N'-dimethylpiperazine, N-methylmorpholine, 1,8-diazabicyclo[5.4.0]undec-7-ene (DBU) and 1,5-diazabicyclo[4.3.0]-5-nonene (DBN); and aromatic tertiary amine compounds such as N,N-dimethylaniline, N,N-diethylaniline, benzyl dimethylamine, triphenylamine, pyridine, 4-dimethylpyridine, 4-hydroxypyridine, 2,2'-dipyridyl, 2,5-dimethylpyrazine and quinoline. Among these, a tertiary amine compound having a cyclic amidine structure with no active hydrogen is preferred in terms of a balance of fluidity and adhesiveness, and there may be exemplified by 1,8-diazabicyclo[5.4.0]undec-7-ene (DBU) and 1,5-diazabicyclo[4.3.0]-5-nonene (DBN).

The tertiary amine compound other than an imidazole compound may be used in an amount of 0.002 to 10 parts by weight, preferably 0.01 to 8 parts by weight, based on 100 parts by weight of the epoxy resin (A), in terms of obtaining good adhesiveness, moisture resistance and curability.

A weight ratio of the tertiary amine compound other than an imidazole compound) to the acid anhydride terminated polyamic acid (the tertiary amine compound other than an imidazole compound)/the acid anhydride terminated polyamic acid) is preferably 0.01 to 6, more preferably 0.025 to 1.25, in terms of a balance of fluidity and adhesiveness.

The curing accelerator may be used alone or in combination of two or more kinds.

(C) Acid Anhydride Terminated Polyamic Acid

The acid anhydride terminated polyamic acid (C) in the present invention can be obtained by reacting a tetracarboxylic dianhydride in a proportion of more than 1 mol with a diamine compound of 1 mol. The molar ratio of tetracarboxylic dianhydride to diamine compound is more than 1, preferably more than 1 and less than or equal to 4, more preferably 1.5 to 2.5. The acid anhydride terminal can be formed by using tetracarboxylic dianhydride at an excessive amount.

As the tetracarboxylic dianhydride, there may be exemplified by a compound represented by the formula (1):

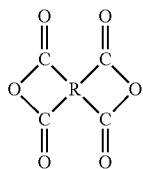

(1)

wherein R is a tetravalent group selected from the group consisting of aliphatic groups having 2 or more carbon atoms, cyclic aliphatic groups, monocyclic aromatic groups, condensation polycyclic aromatic groups and non-condensation polycyclic aromatic groups having aromatic groups mutually connected directly or via a cross linking member.

There may be mentioned C2-C6 alkanetetrayl and C2-C6 alkenetetrayl as the aliphatic group, C3-C10 cycloalkanetetrayl as the cyclic aliphatic group, and benzenetetrayl as the monocyclic aromatic group, and each of the groups may be unsubstituted or substituted with fluorine atoms or the like. As the cross linking member, an oxygen atom, a sulfonyl group and the like may be mentioned.

As the tetracarboxylic dianhydride, there may be mentioned aliphatic tetracarboxylic acid dianhydrides such as, ethylenetetracarboxylic acid dianhydride, butanetetracarboxylic acid dianhydride, cyclopentanetetracarboxylic acid dianhydride; pyromellitic acid dianhydride; 1,1-bis(2,3-dicarboxyphenyl)ethane dianhydride; 1,1-bis(3,4-dicarboxyphenyl)ethane dianhydride; bis(2,3-dicarboxyphenyl)methane dianhydride; bis(3,4-dicarboxyphenyl)methane dianhydride; 2,2-bis(2,3-dicarboxyphenyl)propane dianhydride; 2,2-bis(3,4-dicarboxyphenyl)propane dianhydride; 2,2-bis(2,3-dicarboxyphenyl)-1,1,1,3,3,3-hexafluoropropane dianhydride; 3,3',4,4'-benzophenonetetracarboxylic acid diandydride; 2,2',3,3'-benzophenonetetracarboxylic acid diandydride; 3,3',4,4'-biphenyltetracarboxylic acid dianhydride; 2,2',3,3'-biphenyltetracarboxylic acid dianhydride; bis(3,4-dicarboxyphenyl)ether dianhydride; bis(2,3-dicarboxyphenyl)ether dianhydride; bis(3,4-dicarboxyphenyl)sulfone dianhydride; bis(2,3-dicarboxyphenyl)sulfone dianhydride; 4,4'-(p-phenylenedioxy)diphthalic dianhydride; 4,4'-(m-phenylenedioxy)diphthalic dianhydride; 2,3,6,7-naphthalenetetracarboxylic acid dianhydride; 1,2,5,6-naphthalenetetracarboxylic acid dianhydride; 1,2,3,4-benzenetetracarboxylic acid dianhydride; 3,4,9,10-perylenetetracarboxylic acid dianhydride; 1,2,7,8-phenanthrenetetracarboxylic acid dianhydride and the like. Among these, pyromellitic acid dianhydride is preferred, in terms of adhesiveness.

As the diamine compound, there may be exemplified by a compound represented by the formula (2):

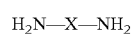

wherein X is a bivalent organic group.

As the bivalent organic group, there may be mentioned bivalent groups selected from the group consisting of aliphatic groups having 1 or more carbon atoms, cyclic aliphatic groups, monocyclic aromatic groups, condensation polycyclic aromatic groups and non-condensation polycyclic aromatic groups having aromatic groups mutually connected directly or via a cross linking member. As the cross linking member, an oxygen atom and the like may be mentioned.

There may be mentioned C2-C6 alkanediyl and C2-C6 alkenediyl as the aliphatic group, C3-C10 cycloalkanediyl as the cyclic aliphatic group, and unsubstituted or substituted benzenediyl as the monocyclic aromatic group, and each of the groups may be unsubstituted or substituted with fluorine atoms or the like. As the cross linking member, an oxygen atom and the like may be mentioned.

As the diamine compound, there may be mentioned p-phenylenediamine, 4,4'-diaminodiphenylmethane, 1,5-diaminonaphthalene, 2,7-diaminofluorene, 4,4'-diaminodiphenylether, 4,4'-(p-phenyleneisopropylidene)bisaniline, 2,2-bis[4-(4-aminophenoxy)phenyl]hexafluoropropane, 2,2-bis(4-aminophenyl)hexafluoropropane, 2,2'-bis[4-(4-amino-2-trifluoromethylphenoxy)phenyl]hexafluoropropane, 4,4'-diamino-2,2'-bis(trifluoromethyl)biphenyl, 4,4'-bis[(4-amino-2-trifluoromethyl)phenoxy]-octafluorobiphenyl and the like. Among these, p-phenylenediamine, 4,4'-diaminodiphenylmethane and 4,4'-diaminodiphenylether are preferred, more preferably 4,4'-diaminodiphenylether, in terms of fluidity.

The polyamic acid comprising recurring units represented by the formula (3) below can be obtained by reacting a tetracarboxylic dianhydride of the formula (1) with a diamine compound of the formula (2).

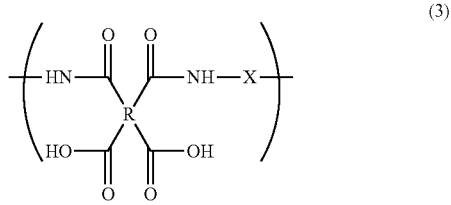

(3)

wherein R is synonymous with R in the formula (1), X is synonymous with X in the formula (2).

The acid anhydride terminated polyamic acid obtained by reacting pyromellitic acid dianhydride (PMDA) with 4,4'-diaminodiphenylether (ODA) in a molar ratio of PMDA to ODA (PMDA/ODA) of more than 1 and less than or equal to 4 is preferable, in terms of adhesiveness.

An acid anhydride terminated polyamic acid can be prepared by reacting a tetracarboxylic dianhydride with a diamine compound in organic solvent. dimethylacetamide (DMAc), tetrahydrofuran (THF) and the like may be used as the organic solvent, and the reaction temperature may be 20 to 100 degrees C. More specifically, ODA is dissolved in dimethylacetamide and toluene mixed solvent, and then toluene and remaining water are removed, followed by heating to 50 to 70 degrees C. After that, PMDA is added, followed by reacting at 70 to 90 degrees C. to obtain the acid anhydride terminated polyamic acid. The production of the acid anhydride terminated polyamic acid can be confirmed by studying the IR peaks of carboxylic acid anhydride, saturated carboxylic acid and amide bond. "Polymer Chemistry" (Dekker, 1984) by Hiemenz also describes the method of preparing an acid anhydride terminated polyamic acid.

The acid anhydride terminated polyamic acid (C) may be used alone or in combination of two or more kinds.

The acid anhydride terminated polyamic acid (C) may be used in an amount of 0.05 to 20 parts by weight, preferably 0.2 to 5 parts by weight, based on 100 parts by weight of the epoxy resin (A), in terms of a balance of fluidity and adhesiveness.

(D) Curing Agent Selected from the Group Consisting of Phenol Resins and Acid Anhydrides The composition of the present invention preferably comprises a curing agent (D) selected from the group consisting of phenol resins and acid anhydrides in terms of high reliability (improvement of crack resistance and moisture resistance), in order to be used suitably in the applications requiring Injection Property, for example when the composition of the present invention is used in combination with the flip chip bonding. Among these, phenol resins are preferably used.

As the phenolic resin, it is not specifically limited, phenol novolac resin, cresol novolac resin, naphthol-modified phenol resin, dicyclopenadiene-modified phenol resin and p-xylene-modified phenol resin and the like may be mentioned. A phenol novolac resin may be substituted by a substituent such as an allyl group and the like. The formulating ratio of the epoxy resin (A) to the phenolic resin is the ratio in which the number of OH group in the phenol resin is preferably 0.3 to 1.5, more preferably 0.5 to 1.2 per one epoxy group in the epoxy resin. The phenol resin may be used alone or in combination of two or more kinds.

As the acid anhydride, it is not specifically limited, methyltetrahydrophthalic anhydride, methylhexahydrophthalic anhydride, alkylated tetrahydrophthalic anhydride, hexahydrophthalic anhydride, methylhymic anhydride, dodecenyl succinic anhydride and methylnadic anhydride and the like may be mentioned. The mixing ratio of the epoxy resin to the acid anhydride is the ratio in which the number of acid anhydride groups in the acid anhydride is preferably 0.4 to 1.2, more preferably 0.6 to 1.0 per one epoxy group in the epoxy resin. The acid anhydride may be used alone or in combination of two or more kinds.

(E) Other Components

An elastomer may be added to the composition of the present invention, in order to relax the stress. As the elastomer, there may be mentioned a butadiene series rubber such as polybutadiene rubber, styrene-butadiene rubber and acrylonitrilebutadiene rubber; polyisoprene rubber; an ethylene propylene series rubber such as an ethylene propylene diene copolymer and an ethylene propylene copolymer; chloroprene rubber; butyl rubber; polynorbornene rubber; silicone rubber; a polar group-containing rubber such as ethylene acrylic rubber, acrylic rubber, propylene oxide rubber and urethane rubber; and a fluorine rubber such as vinylidene fluoride-propylene hexafluoride copolymer and tetrafluoroethylene-propylene copolymer. A solid elastomer can be used and the form is not especially limited. When it is in particulate form, the mean particle size is preferably 10 to 200 nm, more preferably about 30 to 150 nm, more preferably still 80 to 120 nm. As used herein, the mean particle size is a value determined by the dynamic light scattering type particle size distribution meter.

An elastomer which is liquid at the normal temperature may be used. Specifically, there may be mentioned polybutadiene, butadiene acrylonitrile copolymer, polyisoprene, polypropylene oxide and polydiorganosiloxane each of which has a relatively low average molecular weight (for example, a weight-average molecular weight of less than 8000). Moreover, an elastomer having a functional group that reacts with the epoxy group (for example, carboxyl group) at the end may be used, and it may be taken in any form either in solid form or liquid form.

The elastomer may be used in an amount of 20 parts by weight or less, for example, 0.1 to 15 parts by weight, preferably 1 to 10 parts by weight, based on 100 parts by weight of the total amounts of components (A) to (C) and the optional component(s), in terms of obtaining good viscosity of the composition, compatibility or dispersibility with the epoxy resin, properties of the cured material. An elastomer may be used alone or in combination of two or more kinds.

A surfactant may be added to the composition of the present invention, in order to obtain good workability. The surfactant may be an anionic surfactant, a cationic surfactant, a nonionic surfactant or an amphoteric surfactant. An nonionic surfactant is preferred for having little influence on electrical properties. As the nonionic surfactant, there may be mentioned a polyoxyalkylene-containing nonionic surfactant such as a polyoxyethylene alkylether, a polyoxyethylene alkyl arylether, an alkylallylformaldehyde condensed polyoxyethylene ether, a block polymer having polyoxypropylene as lipophilic group, a polyoxyethyene-polyoxypropylene block copolymer, a polyoxyethylene fatty acid ester, a polyoxyethylene glycerol fatty acid ester, a polyoxyethylene sorbitan fatty acid ester, a polyoxyethylene sorbitol fatty acid ester, a polyoxyethylene fatty acid amide; a siloxane-containing nonionic surfactant such as a polyoxyalkylene-modified polysiloxane; an ester type surfactant such as a glycerol fatty acid ester, a polyglycerol fatty acid ester, a sorbitan fatty acid ester, a propylene glycol fatty acid ester, a sucrose fatty acid ester; a nitrogen-containing type surfactant such as a fatty acid alkanol amide, fluorinated surfactant. In particular, a siloxane-containing nonionic surfactant such as polyoxyalkylene-modified polysiloxane, fluorinated surfactant are preferred in order to improve an ability for forming a fillet. These surfactants may be used alone or in combination of two or more kinds.

The surfactant is used preferably in an amount of 1 parts by weight or less, more preferably 0.05 to 0.5 parts by weight, based on 100 parts by weight of the total amounts of components (A) to (C) and the optional component (s), in terms of obtaining good viscosity of the composition, compatibility or dispersibility with the epoxy resin, and desirable properties of the cured material. A surfactant may be used alone or in combination of two or more kinds.

An inorganic filler may be added to the composition of the present invention, for the purpose of adjusting the thermal expansion coefficient. As the inorganic filler, there may be mentioned silica, alumina, boron nitride, aluminum nitride, silicon nitride. Silica may be amorphous silica or crystalline silica. Amorphous silica is preferred. The inorganic filler may be surface-treated by a silane coupling agent and the like. An inorganic filler without surface-treatment may be used.

An inorganic filler may be used in an amount of 80 percent by weight or less, more preferably 30 to 70 percent by weight, based on the total amounts of the composition. The inorganic filler may be used alone or in combination of two or more kinds.

A silane coupling agent such as 3-glycidoxypropyl trimethoxy silane, 3-glycidoxypropyl (methyl)dimethoxy silane, 2-(2,3-epoxycyclohexyl)ethyltrimethoxy silane, 3-methacryloxypropyl trimethoxy silane, 3-aminopropyl triethoxy silane, 3-(2-aminoethyl)aminopropyl trimethoxy silane may be added to the composition of the present invention, for the purpose of improving adhesiveness.

A silane coupling agent may be used in an amount of 3 parts by weight or less, for example, 0.03 to 2 parts by weight, based on 100 parts by weight of the total amounts of components (A) to (C) and the optional component (D). A silane coupling agent may be used alone or in combination of two or more kinds.

A colorant such as carbon black may be added to the composition of the present invention.

A deformer, an inorganic fiber, a flame retarder, an ion trapping agent, an internal mold releasing agent, a sensitizer, and the like may be added to the composition of the present invention in an amount that does not impair the effects of the present invention.

The process for preparing the composition of the present invention is not specifically limited. The composition of the present invention can be prepared, for example, by mixing raw materials in prescribed amounts using a grinding machine, a pot mill, a triple roll mill, a rotary mixing machine, a biaxial mixer and the like.

The composition of the present invention is in a liquid state at normal temperature, and preferably has a viscosity at 25 degrees C. of 0.1 to 150 Pa·s, more preferably, 0.1 to 100 Pa·s. As used herein, viscosity is a value determined at 25 degrees C. by using HB type rotary viscometer (50 rpm).

The composition of the present invention is suitable for an underfill to bond a semiconductor chip with a substrate, particularly advantageous for an underfill for flip chip bonding.

Figure 2:
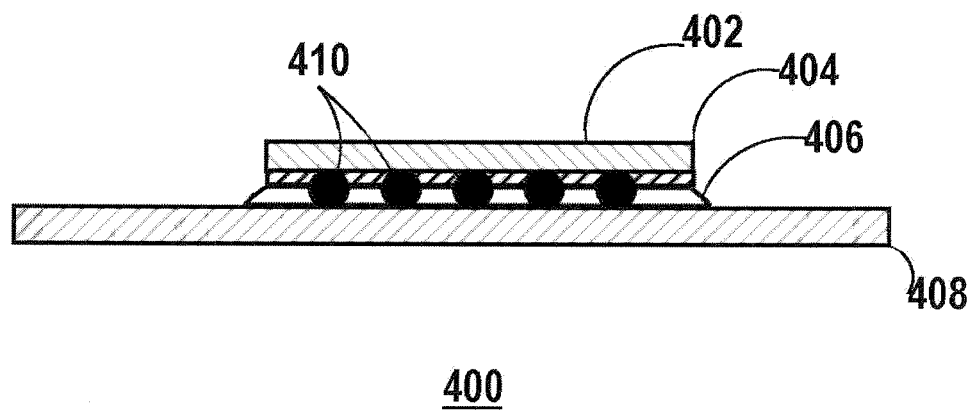
FIG. 2 is a schematic drawing of a flip chip type semiconductor device.

For example, a flip chip type semiconductor device may be obtained by injecting the composition of the present invention between the space of the substrate 408 and the semiconductor chip 402 face-down mounted thereon, followed by curing for encapsulation as shown in FIG. 2. Alternatively, a semiconductor device may be obtained by applying the composition of the present invention to a substrate by using a dispenser and the like; placing a semiconductor chip thereon; and curing by heating for encapsulation.

A semiconductor chip is not specifically limited, and IC, LSI, VLSI and the like may be used. In general, a surface of a semiconductor is covered by a polyimide passivation coating, a nitride coating, an oxide coating and the like, and thus, plasma etching, chemical etching, UV radiation or the like is applied for obtaining good adhesiveness with the underfill material. When using the composition of the present invention, a surface activation treatment as mentioned above is unnecessary to obtaining good adhesiveness. The composition of the present invention may be also used in combination with a semiconductor chip with surface activation treatment.

The substrate is not specifically limited, and a glass-epoxy substrate (e.g. a FR-4 substrate), an aramid substrate, a polyimide substrate, a metal substrate (e.g. silicon substrate), a ceramic substrate and the like may be used.

EXAMPLES

In the following, the present invention is explained in detail by referring to Examples, but the present invention is not limited by these.

(The Preparation of the Composition)

Samples of Examples 1 to 5 and Comparative examples 1 to 3 were prepared with the formulation shown in Table 1 (the unit of the formulation amount is parts by weight) by mixing all components with a roll mill. With regard to the compositions of Examples and Comparative examples, the following tests were carried out. The results are shown in Table 1.

(Viscosity Measurement)

The viscosity is a value measured at 25 degrees C. by using a HB type rotational viscometer (SC4-14/6R spindle, rotation speed 50 rpm).

(Gel Time Measurement)

On the hot plate (Hot Plate HP-19U300 made by Koike Precision Instruments Co., Ltd.) heated at 150 degrees C., 5 mg±1 mg of the composition of Examples and Comparative example was supplied and stirred in a circular motion with a stir stick. Then, the gel time, that is the time from when the composition was supplied till when the length of the cobwebbing, being formed by pulling the stir stick up while stirring, was 5 mm or shorter was measured.

(Injection Property Measurement)

A gap of 50 micrometers was provided on a FR-4 substrate, and the specimen that fixed a glass plate instead of a semiconductor device was prepared. This specimen was put on a hot plate set at 90 degrees C., and the composition of Examples or Comparative examples was spread on one end side of the glass plate of the width of 10 mm, then the time to fill the gap with the composition was measured.

(Shear Bond Strength Test)

On the aluminum substrate 210 having the polyimide passivation coating 208, the composition of the Examples or Comparative examples is applied in the form of cylinder (a bottom surface diameter of 4.75 mm and height of 100 µm), then the aluminum cylinder 202 (a bottom surface diameter of 6.3 mm, and height of 8 mm) having the polyimide coating 204 was placed thereon and a load of 18 g was applied thereto for 5 min, followed by curing under the condition shown in Table 1 (see FIG. 1).

After that, the shear bond strength was measured at a shearing speed of 200 µm/second with a universal testing machine.

The shear bond strength test was also performed with respect to the samples after storing under the conditions of 2 atom, 121 degrees C. at 100% relative humidity for 20 hours.

TABLE 1

|  | Example 1 | Example 2 | Example 3 | Example 4 |
|---|---|---|---|---|
| (a) Bisphenol F type epoxy resin (epoxy equivalent 170) | 22.5 | 23.1 | 23.1 | 22.5 |
| (b) Microcapsulated imidazole | 1.14 | 0.17 | 0.17 | 1.14 |
| Epoxy resin | −0.74 | −0.11 | −0.11 | −0.74 |
| Imidazole compound | −0.4 | −0.06 | −0.06 | −0.4 |
| (c-1) Acid anhydride terminated PAA solution* | 1 | 1 | 1 | 1 |
| Acid anhydride terminated PAA | −0.3 | −0.3 | −0.3 | −0.3 |
| (c-2) Amine terminated PAA solution* | — | — | — | — |
| Amine terminated PAA | — | — | — | — |
| (d-1) tertiary amine compound (DBU) | 0.25 | 0.25 | — | — |
| (d-2) tertiary amine compound (DBN) | — | — | 0.25 | — |
| (e) allylated phenol novolac resin | 18.7 | 18.7 | 18.7 | 18.7 |
| Inorganic filler | 57.4 | 57.4 | 57.4 | 57.4 |
| Silane coupling agent | 0.3 | 0.3 | 0.3 | 0.3 |
| Gel time [sec] | 217 | 160 | 168 | 563 |
| Curing condition temperature/time | 150 degree C./one hour | 150 degree C./one hour | 150 degree C./one hour | 150 degree C./one hour |
| Shear bond strength test: before PCT test** (kgf) | 59 | 59 | 51 | 51 |
| Shear bond strength test: after PCT test** (kgf) | 51 | 47 | 48 | 48 |
| Injection property [sec] | 551 | 340 | 450 | >1200 |

|  | Example 5 | Comp. Example 1 | Comp. Example 2 | Comp. Example 3 |
|---|---|---|---|---|
| (a) Bisphenol F type epoxy resin (epoxy equivalent 170) | 23.2 | 22.5 | 22.5 | 23.2 |
| (b) Microcapsulated imidazole | — | 1.14 | 1.14 | — |
| Epoxy resin | — | −0.74 | −0.74 | — |
| Imidazole compound | — | −0.4 | −0.4 | — |
| (c-1) Acid anhydride terminated PAA solution* | 1 | — | — | 1 |
| Acid anhydride terminated PAA | −0.3 | — | — | −0.3 |
| (c-2) Amine terminated PAA solution* | — | — | 1 | — |
| Amine terminated PAA | — | — | −0.3 | — |
| (d-1) tertiary amine compound (DBU) | 0.25 | — | — | — |
| (d-2) tertiary amine compound (DBN) | — | — | — | — |
| (e) allylated phenol novolac resin | 18.7 | 18.7 | 18.7 | 18.7 |
| Inorganic filler | 57.4 | 57.4 | 57.4 | 57.4 |
| Silane coupling agent | 0.3 | 0.3 | 0.3 | 0.3 |
| Gel time [sec] | 190 | 520 | 533 | >1200 |
| Curing condition temperature/time | 165 degree C./two hour | 165 degree C./two hour | 150 degree C./one hour | 150 degree C./one hour |
| Shear bond strength test: before PCT test** (kgf) | 48 | 84 | 87 | — |
| Shear bond strength test: after PCT test** (kgf) | 44 | 35 | 37 | — |
| Injection property [sec] | 316 | 353 | 417 | >1200 |

*an amount of DMAc solution (30 wt % solution)
**PCT test: the sample was stored under the condition of 2 atom, 121 degrees C. at 100% relative humidity for 20 hours before subjecting the shear bond strength test.

Figure 3A:
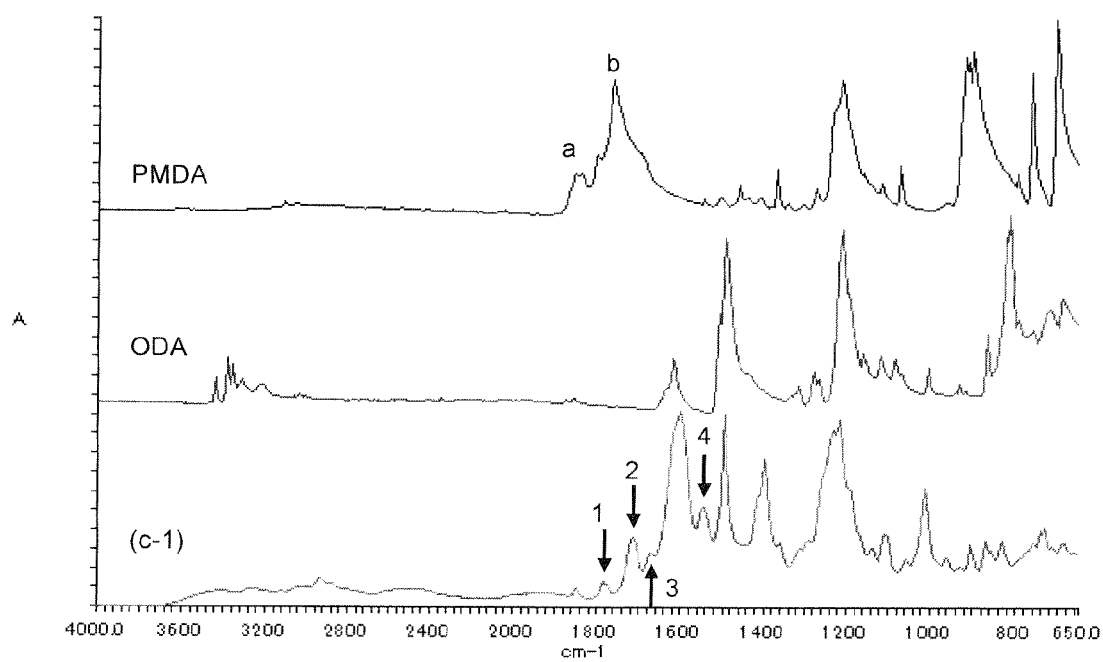
FIGS. 3A and 3B are IR charts of the polyamic acid in Synthesis Examples (c-1) and (c-2)
Figure 3B:
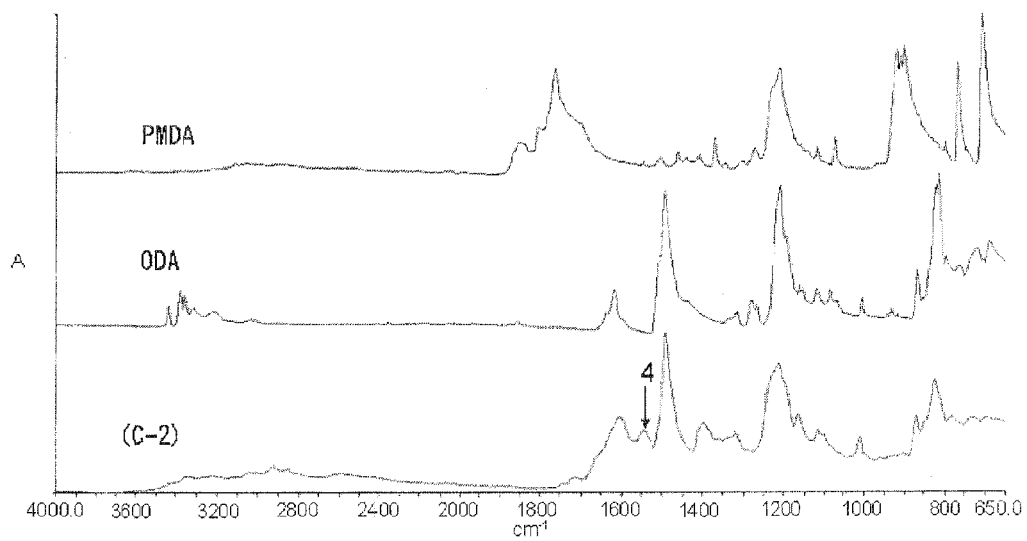
Figure 3C:
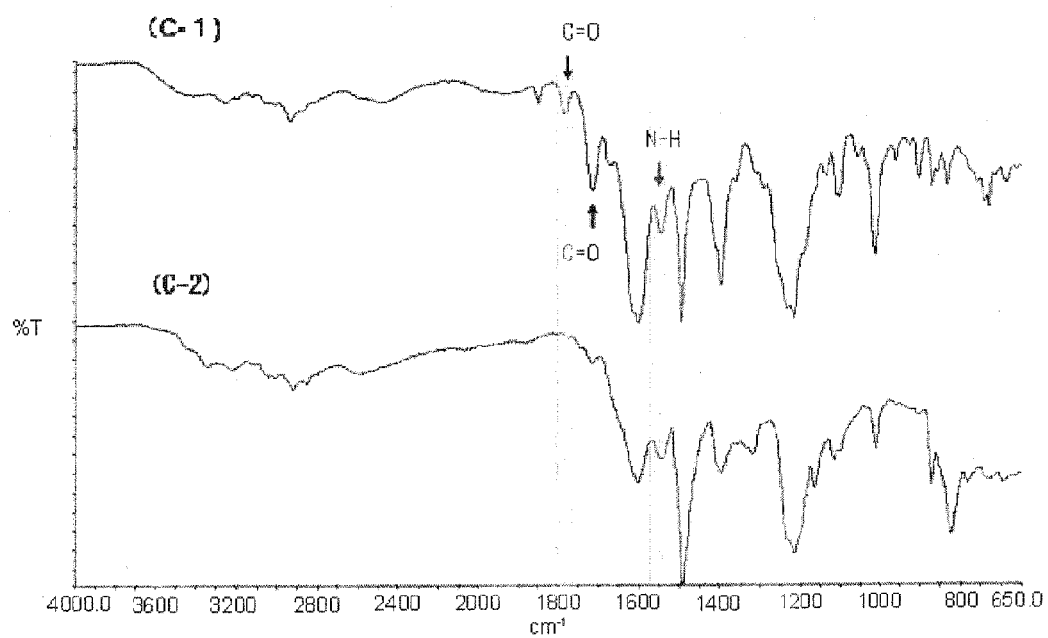
FIG. 3C shows IR charts of both (c-1) and (c-2).

The following are (b), (d-1), (d-2), (e) and other components used in the Examples.
(b) Microcapsulated Imidazole
Trade Name: NOVACURE HX-3088 (imidazole content of 35% by weight); manufactured by Asahi Kasei E-materials Corporation
(d-1) Tertiary Amine Compound (DBU)
 1,8-diazabicyclo[5.4.0]undec-7-ene (DBU)
(d-2) Tertiary Amine Compound (DBN)
 1,5-diazabicyclo[4.3.0]-5-nonene (DBN)
(e) Allylated Phenol Novolac Resin
Trade Name: MEH 8000H (OH equivalent of 140); manufactured by Meiwa Plastic Industries Ltd.
(Other) Inorganic Filler
Spheroidal Silica Particles having an average particle size of 2 μm (Laser diffraction scattering method, Measuring Device: LS13320, Beckman Coulter, Inc.)
(Other) Silane Coupling Agent
3-glycidoxypropyl trimethoxysilane
The following are (c-1) and (c-2) used in the Examples.
The Synthesis of (C-1)
To a reactor equipped with a reflux condenser and a nitrogen-inlet tube, 20 g (0.1 mol) of 4,4'-diaminodiphenyl ether (ODA), 138 g of dimethylacetamide (DMAc) and 125 g of toluene were added, stirred to dissolve ODA, and heated to 130 degrees C. to remove toluene and water. After cooling down to 60 degrees C., the solvent temperature was raised to 82 degrees C. by adding pyromellitic acid dianhydride (PMDA). The resultant was stirred for one hour while maintaining the temperature at 75 degrees C. to obtain a polyamic acid (30 mass % DMAc solution). With respect to the obtained polyamic acid, the peaks of a carboxylic acid anhydride, a saturated carboxylic acid and an amide bond were observed by IR (See FIGS. 3A and 3C), and it is understood that the terminal end is an acid anhydride.
The Synthesis of (C-2)
A polyamic acid (30 mass % DMAc solution) was obtained in the same manner as in the Synthesis of (C-1), except that the amounts of dimethylacetamide (DMAc) and toluene were 98 g and 91 g, respectively, and the amount of PMDA was 4.36 g (0.02 mol). With respect to the obtained polyamic acid, the peaks of a saturated carboxylic acid and an amide bond was observed by IR (See FIGS. 3B and 3C), while the peak of a carboxylic acid anhydride was not found, and it is understood that the terminal end is an amino group.

As seen from Table 1, as for the compositions of Examples 1 to 5, the degradation of bond strength by PCT test was reduced.

INDUSTRIAL APPLICABILITY

According to the present invention, there is provided a liquid epoxy resin composition for semiconductor encapsulation that can provide a cured material thereof which has excellent adhesiveness to a semiconductor chip surface and has an excellent moisture resistance, and a semiconductor device encapsulated thereby. Therefore, the present invention has a high degree of industrial applicability.

The invention claimed is:

1. A liquid epoxy resin composition for semiconductor encapsulation comprising:
   (A) at least one epoxy resin,
   (B) at least one curing accelerator and
   (C) at least one acid anhydride terminated polyamic acid,
   wherein 0.05 to 20 parts by weight of the acid anhydride terminated polyamic acid are present based on 100 parts by weight of the epoxy resin.

2. The liquid epoxy resin composition for semiconductor encapsulation according to claim 1, wherein the acid anhydride terminated polyamic acid is a compound obtained by reacting a tetracarboxylic dianhydride in a proportion of more than 1 mol with a diamine compound of 1 mol.

3. The liquid epoxy resin composition for semiconductor encapsulation according to claim 1, wherein the curing accelerator is at least one compound selected from the group consisting of an imidazole compound and a tertiary amine compound other than an imidazole compound.

4. The liquid epoxy resin composition for semiconductor encapsulation according to claim 3, wherein the curing accelerator comprises the imidazole compound.

5. The liquid epoxy resin composition for semiconductor encapsulation according to claim 4, wherein the curing accelerator(s) further comprises the tertiary amine compound other than an imidazole compound.

6. The liquid epoxy resin composition for semiconductor encapsulation according to claim 3, wherein 0.01 to 10 parts by weight of the imidazole compound is present based on 100 parts by weight of the epoxy resin.

7. The liquid epoxy resin composition for semiconductor encapsulation according to claim 3, wherein 0.002 to 10 parts by weight of the tertiary amine compound other than an imidazole compound is present based on 100 parts by weight of the epoxy resin.

8. The liquid epoxy resin composition for semiconductor encapsulation according to claim 3, wherein the tertiary amine compound other than an imidazole compound is selected from the group consisting of 1,8-diazabicyclo[5.4.0]undec-7-ene (DBU) and 1,5-diazabicyclo[4.3.0]-5-nonene (DBN).

9. The liquid epoxy resin composition for semiconductor encapsulation according to claim 3, wherein the weight ratio of the tertiary amine compound other than an imidazole compound to the acid anhydride terminated polyamic acid is 0.001 to 6.

10. The liquid epoxy resin composition for semiconductor encapsulation according to claim 1, further comprising at least one inorganic filler.

* * * * *